US008581806B2

(12) United States Patent  (10) Patent No.: US 8,581,806 B2
Sato et al.  (45) Date of Patent: Nov. 12, 2013

(54) DISPLAY MODULE

(75) Inventors: Toshihiro Sato, Mobara (JP); Yoshiyuki Kaneko, Hachiouji (JP); Yoshiro Mikami, Hitachioota (JP); Takayuki Ouchi, Hitachi (JP)

(73) Assignees: Hitachi Displays, Ltd., Chiba (JP); Panasonic Liquid Crystal Display Co., Ltd., Hyogo-ken (JP)

( * ) Notice: Subject to any disclaimer, the term of this patent is extended or adjusted under 35 U.S.C. 154(b) by 1229 days.

(21) Appl. No.: 11/180,674

(22) Filed: Jul. 14, 2005

(65) Prior Publication Data

US 2005/0248514 A1 Nov. 10, 2005

Related U.S. Application Data

(63) Continuation of application No. 10/105,273, filed on Mar. 26, 2002, now Pat. No. 6,919,886.

(30) Foreign Application Priority Data

Mar. 28, 2001 (JP) .................................. 2001-092851

(51) Int. Cl.
*G09G 3/30* (2006.01)
(52) U.S. Cl.
USPC ............................................. 345/76; 345/92
(58) Field of Classification Search
USPC .......... 345/76, 82, 77, 92; 257/40, 59, 72, 92, 257/249; 315/169.1–169.3
See application file for complete search history.

(56) References Cited

U.S. PATENT DOCUMENTS

| 4,928,095 | A | | 5/1990 | Kawahara |
| 5,550,066 | A | | 8/1996 | Tang |
| 5,670,792 | A | | 9/1997 | Utsugi |
| 5,896,117 | A | | 4/1999 | Moon |
| 5,940,053 | A | * | 8/1999 | Ikeda ............................. 345/77 |
| 6,011,529 | A | | 1/2000 | Ikeda |
| 6,400,348 | B1 | | 6/2002 | Young |
| 6,522,315 | B2 | * | 2/2003 | Ozawa et al. ................... 345/92 |
| 6,583,577 | B1 | * | 6/2003 | Choi et al. ................. 315/169.3 |
| 6,617,608 | B2 | * | 9/2003 | Bae et al. ......................... 257/40 |
| 7,012,290 | B2 | * | 3/2006 | Kimura .......................... 257/249 |
| 2002/0011796 | A1 | * | 1/2002 | Koyama ..................... 315/169.1 |

FOREIGN PATENT DOCUMENTS

| EP | 0 935 229 | 8/1999 |
| JP | 04-328791 | 11/1992 |
| JP | 6-138440 | 5/1994 |
| JP | 6-161385 | 6/1994 |
| JP | 08-241048 | 9/1996 |
| WO | WO98/36407 | 8/1998 |

* cited by examiner

*Primary Examiner* — Quan-Zhen Wang
*Assistant Examiner* — Yuk Chow
(74) *Attorney, Agent, or Firm* — Antonelli, Terry, Stout & Kraus, LLP.

(57) ABSTRACT

A display module includes a pixel disposed in respective intersections between a plurality of scanning lines and a plurality of data lines, which lines are aligned in a matrix, and a current supply line that supplies electric current to the pixel, the pixel includes a data storage device for storing a data signal supplied from the data lines, and an emitting device that emits light by the electric current supplied by the current supply line according to the data signal stored in the data storage device. One terminal of the data signal storage device is connected to one of the scanning lines placed anteriorly of to the pixel that is being selected.

20 Claims, 10 Drawing Sheets

1 DISPLAY MODULE

US 8,581,806 B2

DISPLAY MODULE

CROSS REFERENCE TO RELATED APPLICATION

This application is a continuation application of U.S. Ser. No. 10/105,273, filed Mar. 26, 2002, now U.S. Pat. No. 6,919,886 the contents of which are incorporated herein by reference.

FIELD OF THE INVENTION

The present invention relates to an active matrix display module, especially, pertaining to such display module as being provided with pixels comprising such emitting devices as an EL (electro luminescence) device or a LED (light emitting diode) wherein light is emitted by conducting electric current through such an emitting layer as an organic semiconductor thin film and with pixels circuits to control the emitting operation of those pixels.

BACKGROUND OF THE INVENTION

Recently, the advent of advanced information network system in our modern life increases the demand for personal computers, car navigation systems, portable remote terminals and communication network equipment or the combined products thereof. For such products as mentioned above, such a display device as being thin in thickness, light in weight and of lower power consumption is suitable so that a liquid crystal display or a display module incorporating such electrooptic devices as a self-luminous EL device or LED therein are in practical use.

The latter display module is characterized in being good at visibility, possessed with wide viewing angle and being suitable for motion display due to its high response, which module is said to especially opt for image display. In particular, a display incorporating an organic EL device (also referred to as an organic LED device; hereinafter, referred to as OLED in abbreviation, where appropriate), the emitting layer of which device is made from organic matter, is highly expectable in accordance with the greater improvement of the luminous efficiency thereof and the progress of the network technology that enhances the feasibility of image communication. The OLED display is of diode structure in which an organic emitting layer is interposed between two pieces of electrodes.

As described below, the active matrix driving method in which thin film transistors (hereinafter, referred to as TFT where appropriate) serve as the switching devices of pixels is effective for enhancing the power efficiency of such OLED display as mentioned above. The operation of the OLED display by the active matrix deriving method in the prior arts is disclosed in the Japanese Patent Application Laid-open Nos. HEI 4-328791 and 8-241048 or the U.S. Pat. No. 5,550,066, for instances, the driving voltage of which display is disclosed in the International Publication No. WO98-36407 and so forth.

The typical pixel structure of the OLED display comprises two TFTs equivalent to a first active device and a second active device, the first of which is a switching transistor while the second of which is a driver transistor, and a pixel driving circuit (hereinafter, referred to as a pixel circuit where appropriate) comprising one storage capacitance for a data signal storage device, which pixel circuit controls the emitting luminance of the OLED display. The pixels are disposed at the respective intersections of a matrix in which the data lines having M in number to which data signals (or image signals) are supplied and the scanning lines (hereinafter, referred to as gate lines where appropriate) having N in number are aligned in the arrangement of N lines×M rows.

To drive the pixels, the scanning signals (gate signals) are subsequently supplied to the gate lines having N in number so as to put the switching transistors into on-state condition, and one time of the vertical scanning operation is over within one frame period of Tf so as to freshly supply the on-state voltage to the first gate line.

In the above driving method, the time required for supplying the on-state voltage to one gate line is defined as Tf/N or below. Generally, the value of the one frame period of Tf is in the order of $\frac{1}{60}$ second in practical use. During the on-state voltage is supplied to a certain gate line, all the switching transistors that are connected to the corresponding data line are put into on-state condition, in synchronization with which the data voltage (image voltage) is simultaneously or subsequently supplied to the data lines having M rows in number, which arrangement is general in the active matrix liquid crystal display.

The data voltage, during the on-state voltage is supplied to the gate line, is stored in storage capacitance (capacitor) so as to be maintained substantially as it is during the one frame period. The voltage value of the storage capacitance regulates the gate voltage of the driver transistor.

Accordingly, the value of the current flowing through the driver transistor is controlled so as to put the light emission of the OLED under control. The response time for the OLED to begin emitting light upon the application of voltage thereto normally takes one µs or below so that it manages to follow the motion image of quick tempo.

The active matrix driving method realizes high efficient operation by performing light emission over the one frame period. The difference with the passive matrix driving method, in which the respective electrodes of the OLED diode are directly connected to the scanning line and the data line without the provision of any TFTs, is clear as follows.

In the passive matrix driving method, the current flows through the OLED only during the short period when the scanning line is selected, so that emitting luminance corresponding to practically several times as many as the number of the scanning lines is required for obtaining the same luminance as that of the one frame period of the active matrix driving method with the light emission performed during such short period as mentioned above. Thus, it is unavoidable that the driving voltage and current in use enlarge, which causes large loss of power consumption such as heating so as to deteriorate power efficiency.

In view of the foregoing, it is found that the active matrix driving method is superior to the passive one in light of the reduction of power consumption.

SUMMARY OF THE INVENTION

The active matrix driving OLED display module is arranged such that current supply to capacitors to keep display over one frame period is carried out by connecting one electrode thereof to an output terminal of the switching transistors while connecting the other electrode thereof to either a common voltage line exclusively used for the capacitors or a current supply line that supplies current to an OLED.

FIG. 8 is a block diagram to show one example of the prior OLED display module while FIG. 9 is an explanatory view to show the pixel arrangement of the module as shown in FIG. 8. This display module 1 (image display module) is arranged on a substrate 6 made from such insulating material as glass such that a data driving circuit 3, a gate driving circuit 4 and a current supply circuit 5 are disposed in the surrounding of a display section 2 as surrounded by the dotted line in the drawing, in which section the plurality of data lines 7 and the plurality of gate lines 8 are aligned in a matrix.

The data driving circuit 3 includes a complementary circuit of an NP-channels TFT or a shift register circuit, a level shifter circuit and an analog switch circuit comprising a single (N or P) channel TFT. To note, the current supply circuit 5 may be modified into just a bus line while the current may be supplied from an external current supply source.

FIG. 8 shows a system in which a common voltage line 9 designed for the capacitors is provided in the display section 2, to which common voltage line 9 the other electrodes of the capacitors are connected. The common voltage line 9 is led out to an external common voltage source from a terminal 11 of a common voltage supply bus line 9A.

As shown in FIG. 9, a pixel 20 comprises a TFT 21 or a switching transistor, a TFT 22 or a driver transistor, a capacitor 23 and an OLED 24, which are disposed in the region surrounded by the data line 7 and the gate line 8. The gate of the TFT 21 is connected to the gate line 8 while the drain thereof is connected to the data line 7. The gate of the TFT 22 is connected to a source of the TFT 21, to which source one electrode (positive pole) of the capacitor 23 is connected.

The drain of the TFT 22 is connected to a current supply line 10 while the source thereof is connected to the organic light emitting diode OLED 24. The other electrode (negative pole) of the capacitor 23 is connected to the common voltage line 9. The data line 7 is driven by the data driving circuit 3 while the scanning line (or gate line) 8 is driven by the gate driving circuit 4. A current supply line 10 is connected through the current supply bus line 10A to the current supply circuit as shown in FIG. 1.

In FIG. 9, when the TFT 21 is put into on-state condition upon the selection of one pixel 20 by the gate line 8, a video signal supplied from the data line 7 is stored in the capacitor 23. Then, when the TFT 21 is put into off-state condition, the TFT 22 turns into on-state condition so that the current flows from the current supply line 10 to the OLED 24, which current keeps intact practically over one frame period. The current in conduction at this time is regulated by a signal charge stored in the capacitor 23.

The operation level of the capacitor 23 is regulated by the electric potential of the common voltage line 9, which controls the light emitting behavior of the pixel.

The above system requires the provision of the common voltage line 9 that gets through a portion of the pixel region, which causes the deterioration of a so-called aperture ratio and constraints the displaying brightness of the module on the whole from improving.

FIG. 10 is a block diagram to show another example of the prior OLED display module in the similar arrangement to that as shown in FIG. 9. The basic alignment of the TFT 21 and TFT 22 and the capacitor 23 comprising the respective pixels is the same as shown in FIG. 9, the difference with which lies in the fact that the other end of the capacitor 23 is connected to the current supply line 10.

That is, when the TFT 21 is put into on-state condition upon the selection of one pixel 20 by the gate line 8, a video signal supplied from the data line 7 is stored in the capacitor 23, and when the TFT 22 turns into on-state condition while the TFT 21 is put into off-state condition, the current flows from the current supply line 10 to the OLED 24, which current keeps intact practically over one frame period in the same way as the example shown in FIG. 9. The current in conduction at this time is regulated by a signal charge stored in the capacitor 23, and the operation level of the capacitor 23 is regulated by the electric potential of the current supply line 10, which controls the light emitting behavior of the pixel.

In the above prior example, there is likelihood that not only dot defect but also vertical and horizontal line defect might occur, when short circuit is caused in the upper and lower electrodes of the capacitor 23 so as to cause large electric current owing to the fact that the current supply line connected to the capacitor 23 is situated at a high-voltage side of the substrate.

The present invention is to provide a display module incorporating such an electrooptic device as the OLED therein, the arrangement of which module allows the aperture ratio of the pixels to improve and to prevent such display fault as line defect so as to display image with high quality as well as avoids the increase of the number of production process thereof.

In order to achieve this purpose, an active matrix display module is provided herein wherein the plurality of scanning lines and the plurality of the data lines ate aligned in a matrix, which module comprises a pixel in respective intersections between said scanning lines and data lines and a current supply line that supplies electric current to the pixels for display, wherein said pixel comprises an active device that is selected by the scanning line, a data storage device that stores a data signal that is supplied from the data line when the active device is put into on-state condition and an emitting device that emits light by the electric current supplied from the current supply line according to the data signal as stored in the data storage device, wherein a reference voltage of the data storage device for driving the emitting device over a fixed period is a voltage of the scanning line placed immediately anterior to the pixel that is being selected.

This arrangement allows the aperture ratio of the pixels to improve and image to be displayed with high quality as well as avoids the increase of the number of the production steps thereof so as to reduce the production cost. The more concrete arrangements of the display module according to the present invention are described below.

(1) The display module of the present invention comprises a pixel disposed in the respective intersections between the plurality of scanning lines and the plurality of data lines, which lines are aligned in a matrix, and a current supply line that supplies the electric current to the pixels, wherein said pixel comprises a pixel circuit provided with a first active device and a second active device as well as a data signal storage device, a pixel electrode in which an emission and non-emission of the pixel is controlled by a signal output by the pixel circuit and a common electrode, wherein an output terminal of the first active device is connected to an input terminal of the second active device and one terminal of the data signal storage device is connected to a point where the output terminal of the first active device and the input terminal of the second active device connect, wherein the first active device is switched into one of on-state and off-state condition by a gate signal supplied from the scanning line wherein in the on-state condition thereof a data signal supplied from the data line is stored in the data signal storage device, wherein the second active device in the off-state condition of the first active device supplies electric current from the current supply line to the pixel electrode according to the data signal stored in the data signal storage device, wherein the other terminal of the data signal storage device is connected to a scanning line, to which the gate signal of the pixel electrode scanned anterior to the scanning line to switch the first active device is supplied.

(2) In the arrangement (1), the current supply lines are provided in parallel with the data lines.
(3) In the arrangement of either (1) or (2), the first and second active devices are thin film transistors and the data signal storage device is a capacitor.
(4) In any one of the arrangements (1) to (3), the gate driving circuit that supplies gate signals to the plurality of scanning lines, the data driving circuit that supplies data signals to the plurality of data lines and the current supply circuit that supplies electric current to the current supply lines are provided in the substrate in which the scanning lines, the data lines and the current supply lines are provided.
(5) In any one of the arrangements (1) to (4), an emitting layer interposes between the pixel electrode and the common electrode comprising the pixel.
(6) In the arrangement (5), the emitting layer is an organic emitting layer.

It should be appreciated that the present invention is not limited to the above arrangements and the embodiments as described below, but it can be modified into various manners within the scope of the accompanying patent claims. The other objects and arrangements of the present invention are clarified from the following description.

BRIEF DESCRIPTION OF THE PREFERRED EMBODIMENT

Hereinafter, the preferred embodiments of the present invention are described in details with reference to the accompanying drawings. The organic emitting layer of the respective pixels as described below is divided into such types as emitting light with luminance in proportion to the value of the current and with a color (including white) inherent in an organic material in use and incorporating a red, green, blue or other color filter into the organic layer to emit white light so as to display color image.

Figure 1:
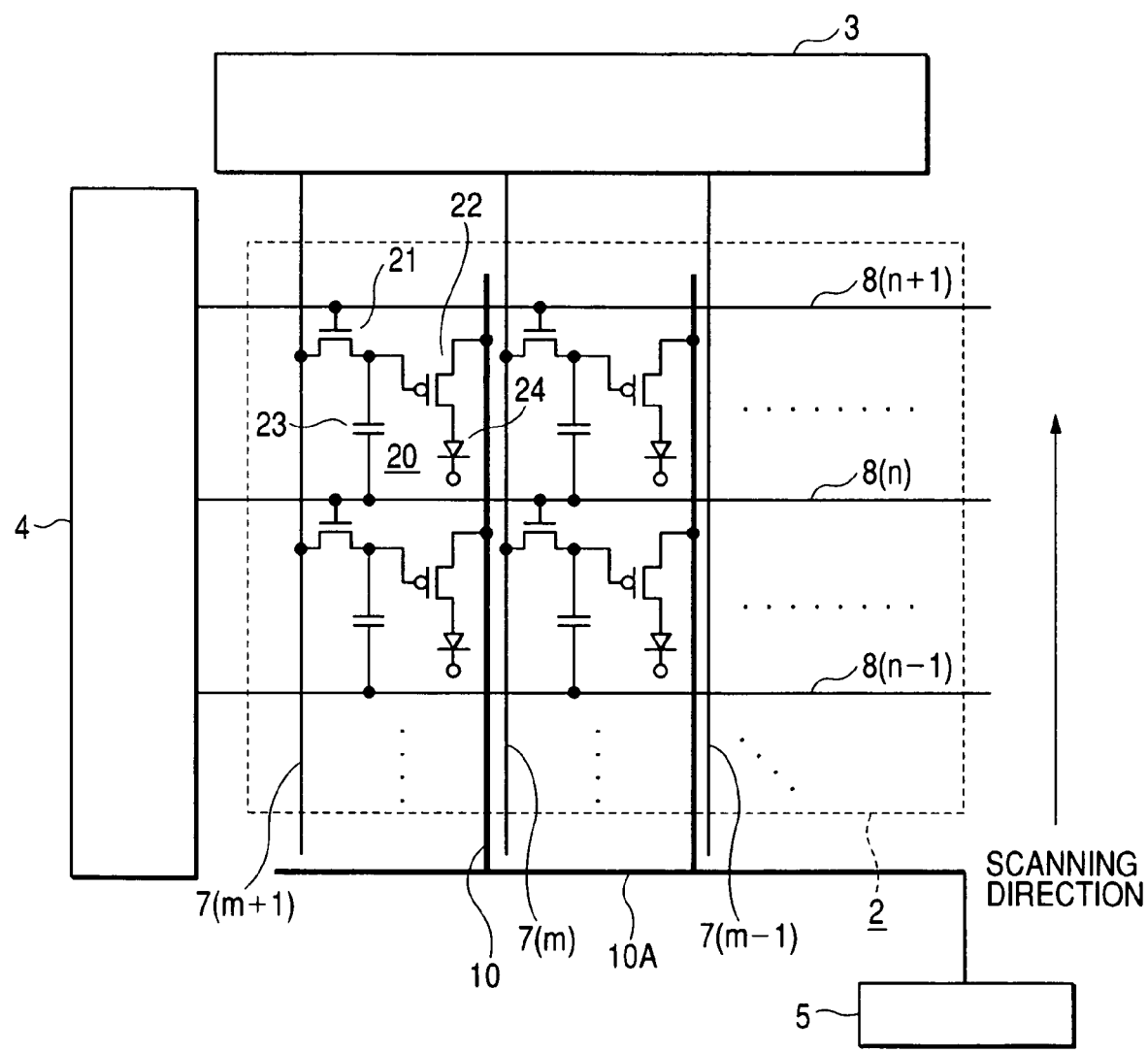
FIG. 1 is a block diagram to show the arrangement of the first embodiment of the display module according to the present invention.
Figure 2:
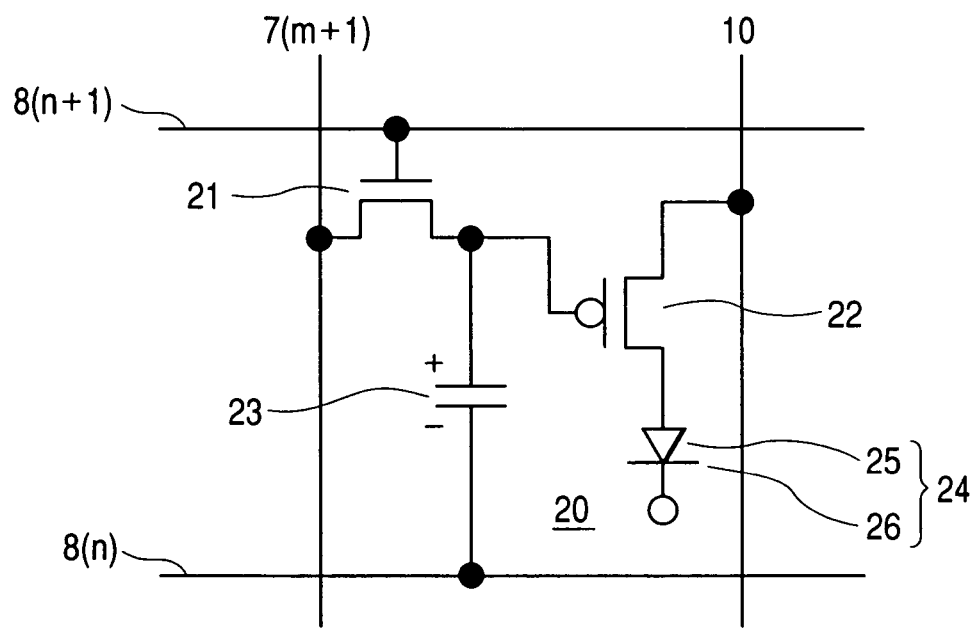
FIG. 2 is a circuit view to show the detailed arrangement of one pixel of the module as shown in FIG. 1.
Figure 10:
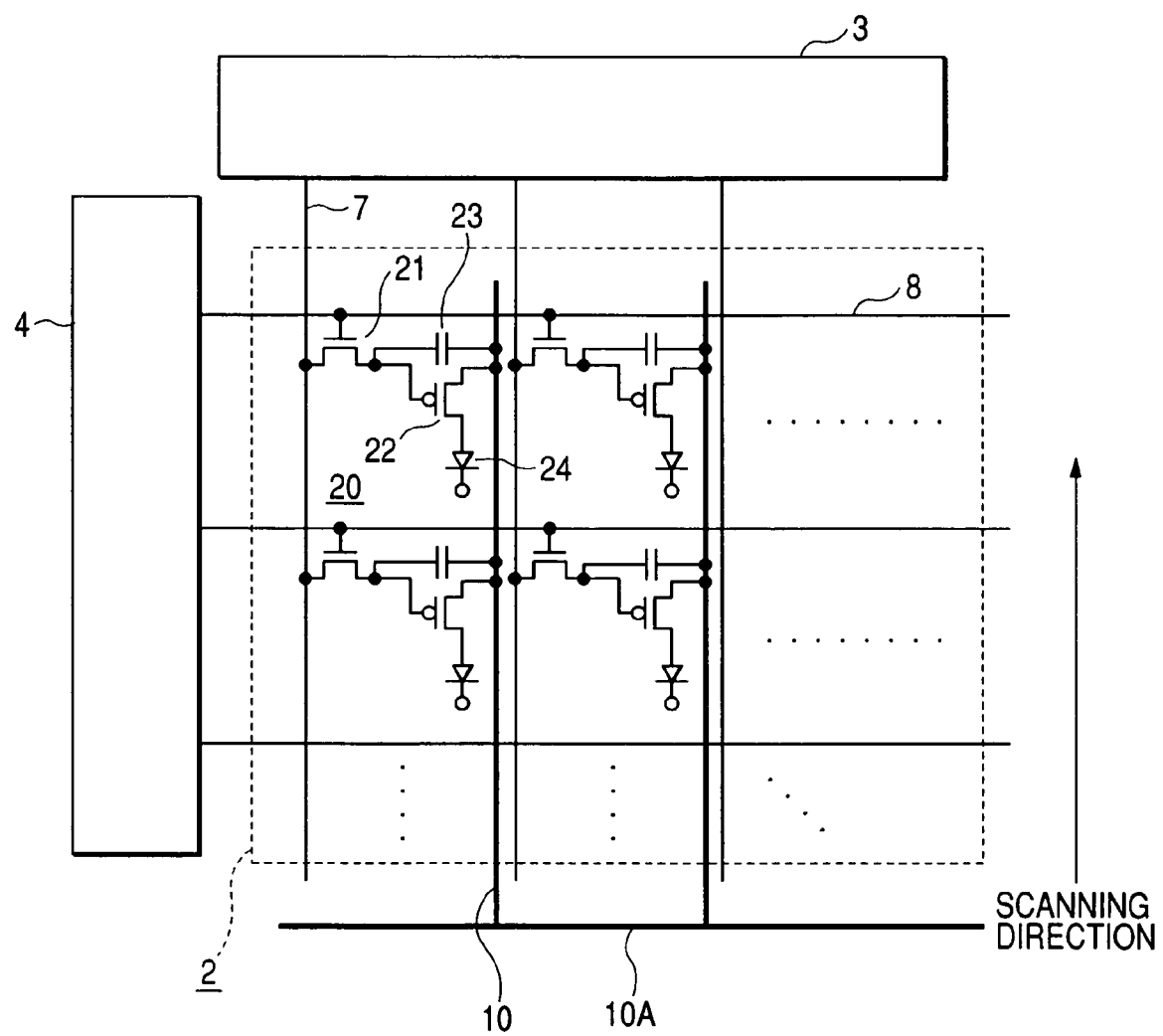
FIG. 10 is a block diagram like FIG. 9 to show the arrangement of another example of the prior OLED display module.

FIG. 1 is a block diagram to show the arrangement of the first embodiment of the display module according to the present invention while FIG. 2 is a circuit view to show the detailed arrangement of one pixel of the module as shown in FIG. 1. In the present embodiment, in the same way as shown in FIG. 10, data lines 7, scanning lines 8 and current supply lines 10 are provided in the display region 2. In the drawings, the scanning lines 8 are represented with $8(n+1)$, $8(n)$ placed anterior thereto and $8(n-1)$ placed farther anterior thereto while the data lines 7 are represented with $7(m+1)$, $7(m)$ and $7(m-1)$.

For the sake of conveniences, the scanning line as being scanned (or selected) is regarded as the $8(n+1)$ in the following description. Attention is paid to the Pixel 20 among the plurality of pixels as selected by the scanning line $8(n+1)$. The first TFT 21 and the second TFT 22 that are active devices are a switching transistor and a driver transistor respectively. The gate of the first TFT 21 is connected to the scanning line $8(n+1)$ and the drain thereof is connected to the data line $7(m+1)$ while the source thereof is connected to the gate of the second TFT 22.

The drain of the second TFT 22 is connected through a current supply line 10A to a current supply line 10. The source thereof is connected to an anode of an OLED 24. One terminal of a capacitor 23 for a data signal storage device is connected to a point where the source of the first TFT 21 and the gate of the second TFT 22 connect while the other terminal thereof is connected to the scanning line $8(n)$ placed anterior to the $8(n+1)$.

In the circuit arrangement of one pixel as shown in FIG. 2, one terminal of the capacitor 23 that is connected to the point where the source of the first TFT 21 and the gate of the second TFT 22 connect is of positive pole while the other terminal thereof as connected to the scanning line $8(n)$ is of negative pole. The OLED 24 is arranges such that an organic emitting layer, which is not shown in the drawings, interposes between the anode 25 and the cathode 26 thereof, the anode 25 being connected to the source of the second TFT 22 and the cathode 26 being connected to an electrode provided on the side of the same and comprising the pixel, which electrode is not shown in the drawings.

In the above arrangement, the driving operation of the respective pixels for display, which pixels are in connection with the prior scanning line $8(n)$, is over wherein the TFTs (the first TFTs) thereof are on off-state condition over most of the one frame (or one field) period. That is, the electric potential of the scanning line $8(n)$ is on a given low voltage state, which state does not fluctuate during most of the one frame (or field) period.

Thus, the capacitor 23 of the pixel in connection with the scanning line $8(n+1)$ as being scanned stably stores a data signal as written therein from the data line $7(m+1)$, which allows the electric current that conducts into the OLED 24 through the second TFT 22 from the current supply line 10 to correctly correspond to the data signal as stored in the capacitor. This also applies to all the pixels that are in connection with the scanning line $8(n+1)$.

Figure 8:
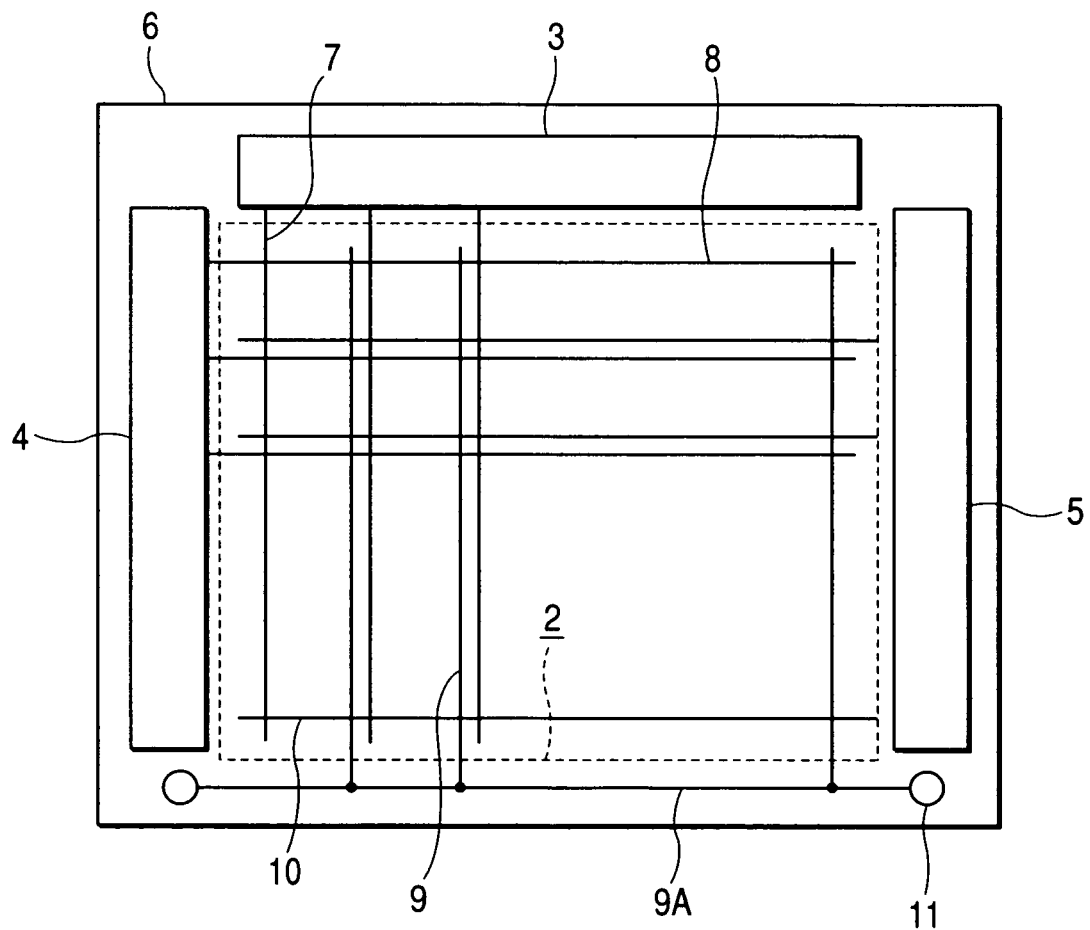
FIG. 8 is a block diagram to show the arrangement of one example of the prior OLED display module.
Figure 9:
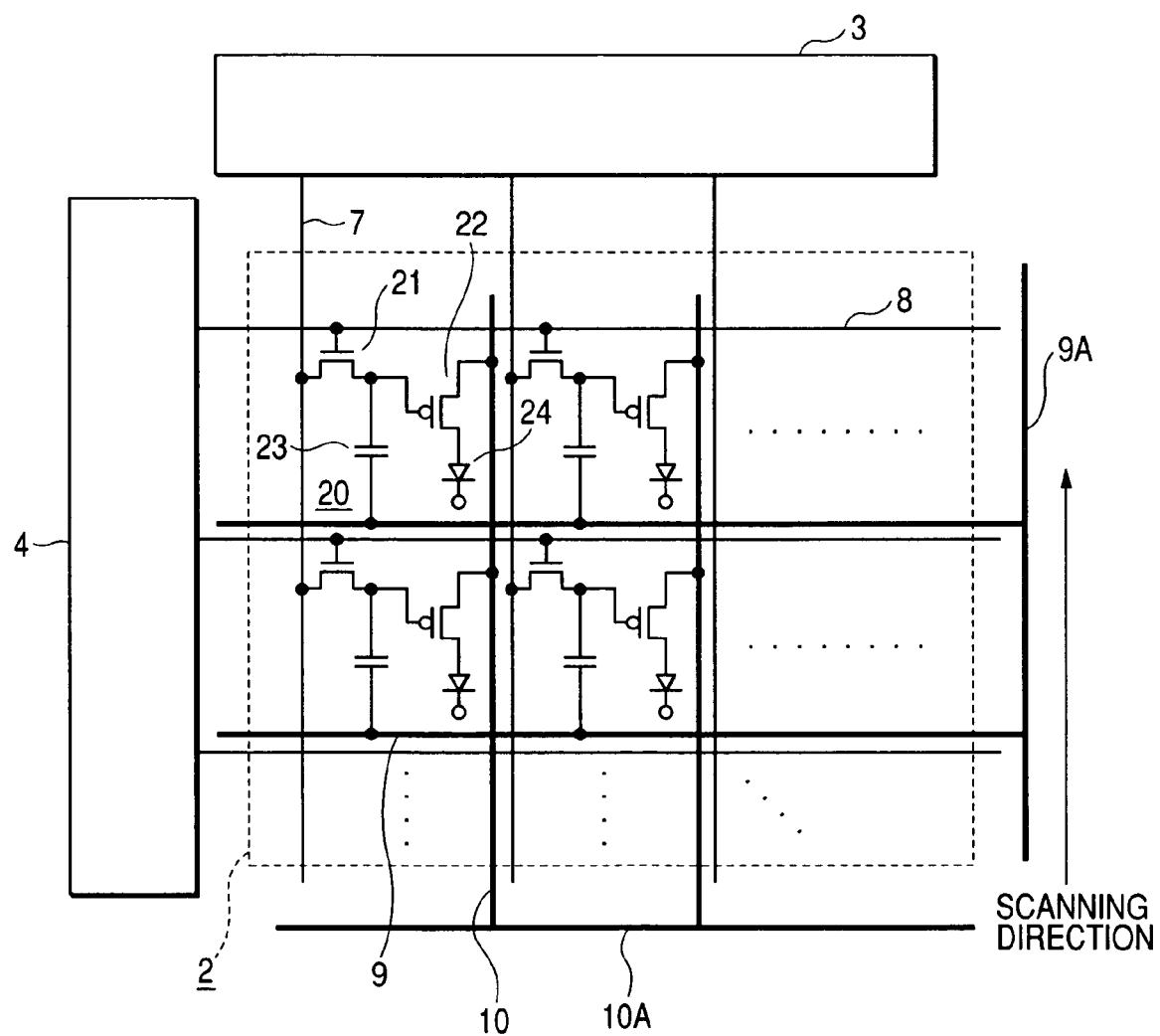
FIG. 9 is a view to show the pixels arrangement of the display module as shown in FIG. 8.

The arrangement hereof allows the voltage of the capacitor 23 for the data signal storage device to keep intact, so that there is no case where the reference voltage of the capacitor fluctuates owing to the inflow of the electric current into the OLED that occurs in the prior display module as shown in FIG. 10, with the result that there is no fluctuation of the light emitting quantity of the OLED, which allows image to be displayed with high quality. Further, the riddance of the common voltage line of the display module as shown in FIG. 8 or 9 improves the aperture ratio of the pixel and avoids the increase of the number of the production steps thereof, which brings the production cost thereof to reduction.

Then, the arrangement of the display module according to the present invention is more concretely described below.

The data signal (image signal etc.) may be supplied to the data line in analog or time sharing digital quantity, and the system in which the area of the respective pixels is divided may be incorporated. Normally, the pixel circuit is produced by the low temperature polysilicone TFT technique. In this case, it is preferred that the electrodes comprising the capacitor utilize a layer of the channel and gate portions of the transistor. The channel portion thereof is spaced apart from the gate portion thereof by a thin insulating layer, which allows an area for securing the capacitance as required to be rendered narrower.

Figure 3:
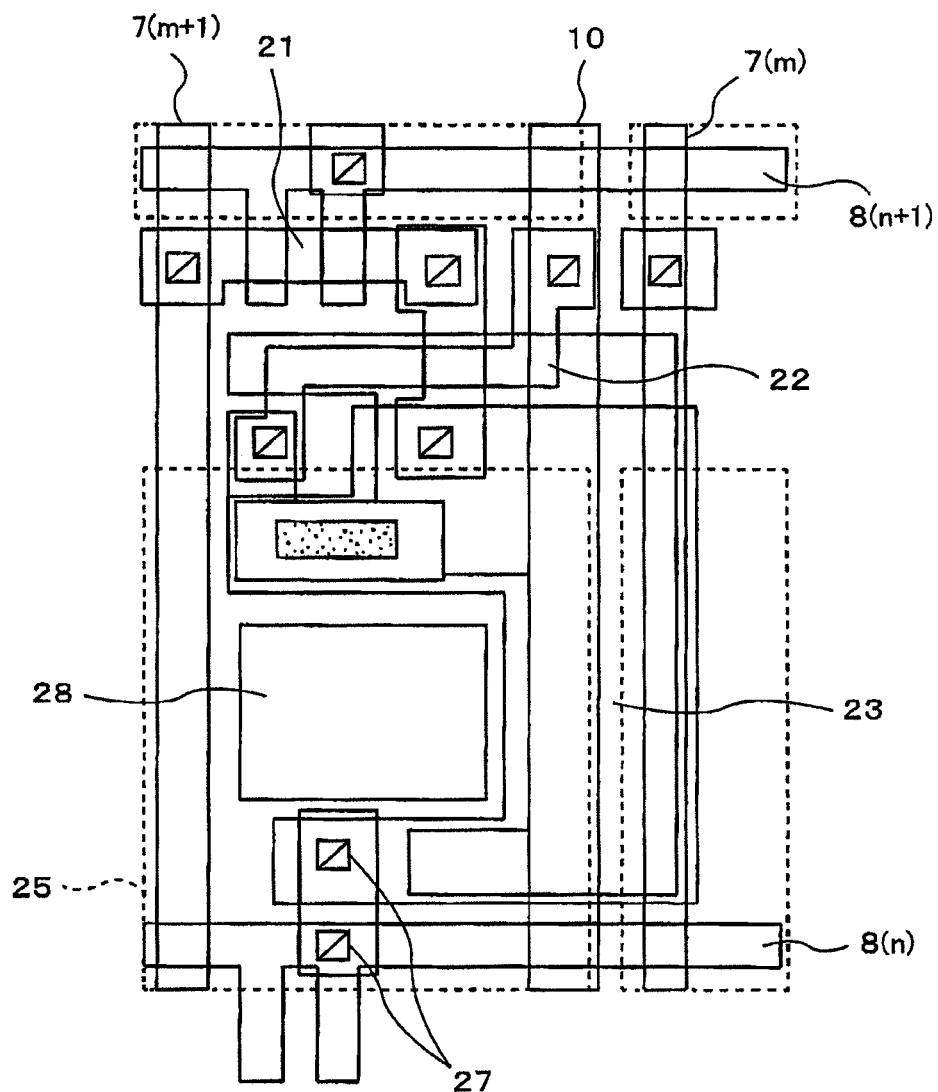
FIG. 3 is a plan view in the vicinity of one pixel to show one example of the display module according to the present invention.
Figure 4:
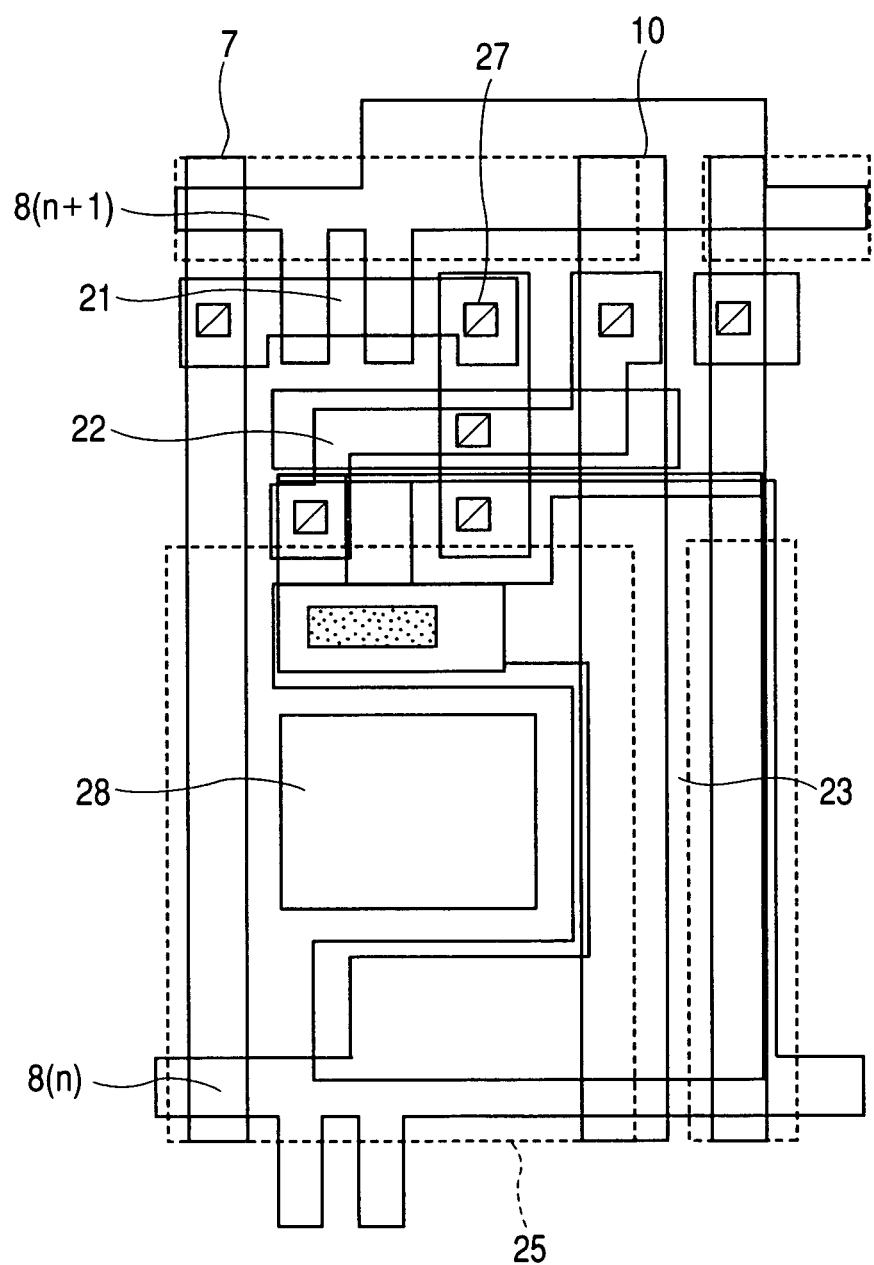
FIG. 4 is a plan view in the vicinity of one pixel to show another example of the display module according to the present invention.

FIGS. 3 and 4 show a plane view of the vicinity of one pixel of the display module according to the present invention. In the drawings, reference numerals 7, 8(n) and 8(n+1), and 10 indicate a data line, scanning lines, and a current supply line respectively. One pixel is surrounded by the scanning lines 8(n) and 8(n+1) and the current supply line 10, in which the first TFT 21, the second TFT 22, the capacitor 23, the anode 25 of the OLED as indicated with the dotted line, a contact hole 27 for connecting the data line 7, the scanning lines 8(n) and 8(n+1) as well as the current supply line 10 to the respective TFTs and the capacitor 23, an aperture 28 to receive an organic emitting layer therein are included.

The pixel circuit is surrounded by the current supply line 10 to the OLEDs, which line is disposed vertically with regard to the drawings in the same direction as the data line 7 to supply image signal and as such, and the gate lines 8(n) and 8(n+1) as disposed horizontally with regard thereto. The switching transistor for the first TFT 21 writes the data signal supplied from the data line into the capacitor 23 of the pixel circuit.

The dual gate system is adopted for the first TFT 21 in order to abate the decrease of the storage charge of the capacitor 23 owing to leaking current. The driver transistor for the second TFT 22 is disposed in folds in order to obtain a comparatively large gate length. The capacitor 23 is disposed under the wiring system in order to reduce the affect of the pixel upon the aperture 28. The other pole (the other terminal) of the capacitor 23 is electrically connected to the gate line that is scanned anterior to that being scanned.

There are two methods for the connection thereof to the prior gate line according to which electrode (terminal) of the capacitor 23 is connected thereto. FIG. 3 shows the case where the lower electrode thereof is connected thereto while FIG. 4 shows the case where the upper electrode thereof is connected thereto.

Generally, it is required to make either of the electrode thereof conductive for the purpose of forming a capacitor by overlaying two electrodes one over another. The lower electrode thereof is made from the same material as that for the channel portion of the transistor, so that it is basically required to perform doping operation on the whole surface thereof by such method as ion implantation for the purpose of making the whole surface thereof conductive. Such conductive material as metal is normally adopted for the upper electrode thereof.

The ion implantation onto the whole surface of the lower electrode thereof should be performed before the formation of the upper electrode thereof, which is not desirable because it increases the number of production process. The polarity of the electrodes thereof is taken into considerations in the present embodiment in order to dispense with the ion implantation for rendering the whole surface of the lower electrode thereof conductive. It is known that the movement of carrier occurs without performing the ion implantation on the whole surface thereof so as to serve as a capacitor, presuming that where the n-type ion doping is performed is a low-tension side while where p-type ion doping is performed is a high-tension side. Accordingly, the ion implantation is not performed on the whole surface thereof, which is performed after the formation of the upper electrode thereof in this embodiment.

Provided that the first TFT 21 for the switching transistor is of n-type transistor, the voltage applied to the gate line is on low voltage or off-state condition during most of the frame period and turns into on-state condition only during the writing operation of the data signal. In this case, it is preferable that where the lower electrode thereof is connected to the prior gate line, the n-type ion implantation is performed while the p-type ion implantation is performed where the upper electrode thereof is connected thereto.

In the arrangement as shown in FIG. 3, the other terminal of the capacitor 23 of the pixel under scanning is connected through a contact hole 27 as shown therein to the prior gate line 8(n).

In the arrangement as shown in FIG. 4, the gate line 8(n) extends over to the capacitor portion of the 8(n+1) so as to be used as an upper electrode of the same. Thus, the switching transistor is connected to the lower electrode thereof.

Figure 5A:
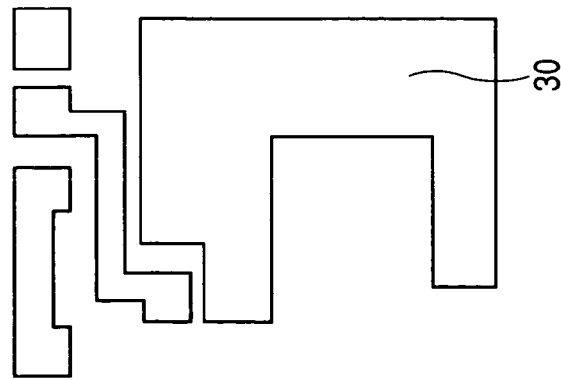
FIG. 5 is a view to show the formation step of the respective structural layers of the display module as shown in FIG. 3.
Figure 5B:
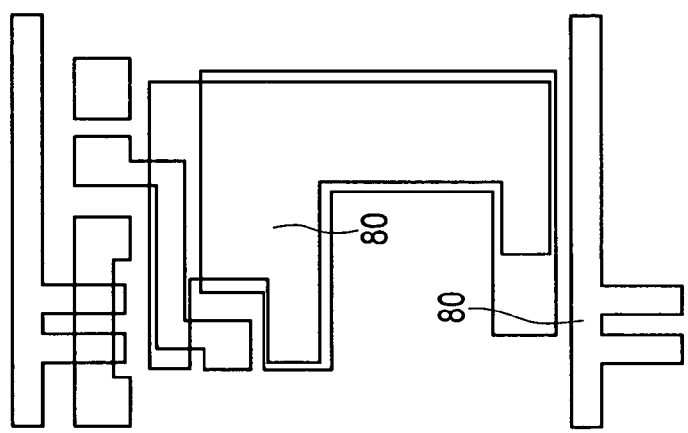
Figure 5C:
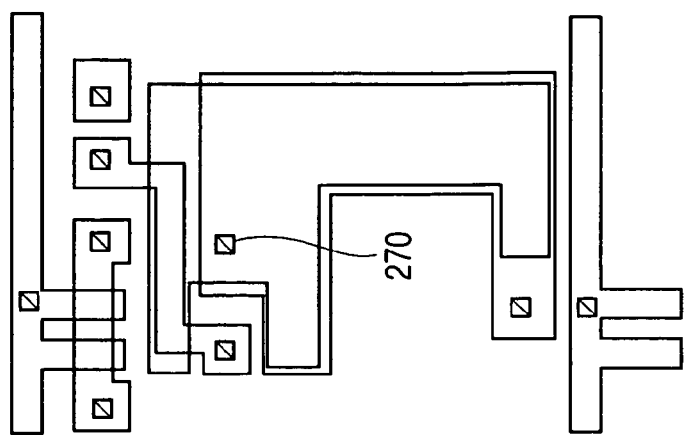
Figure 6F:
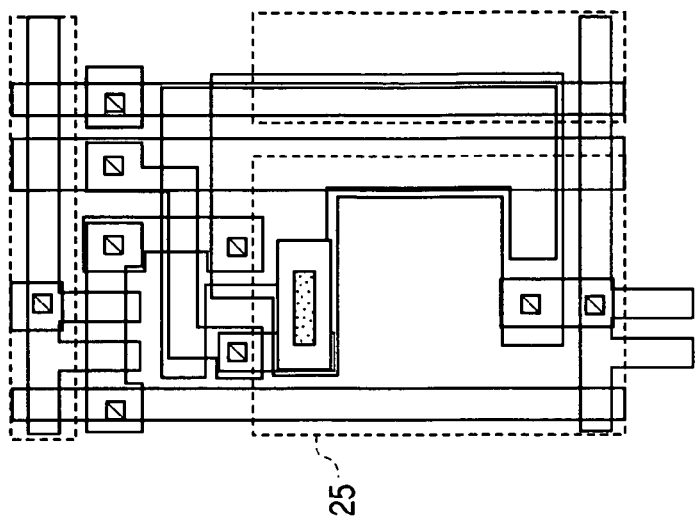
FIG. 6 is a view to show the formation step of the respective structural layers of the display module as shown in FIG. 3 following the step as shown in FIG. 5.
Figure 6E:
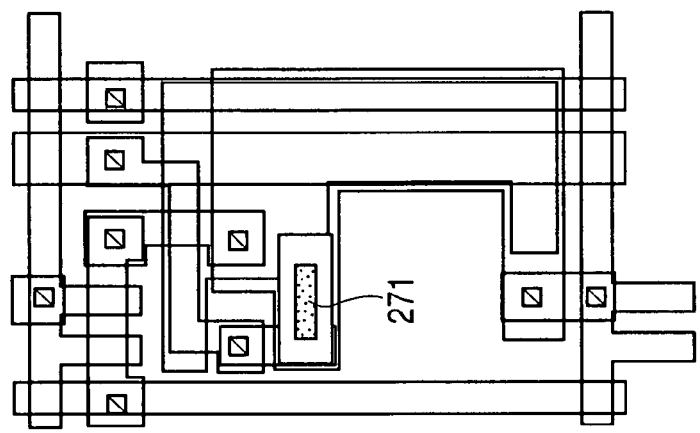
Figure 6D:
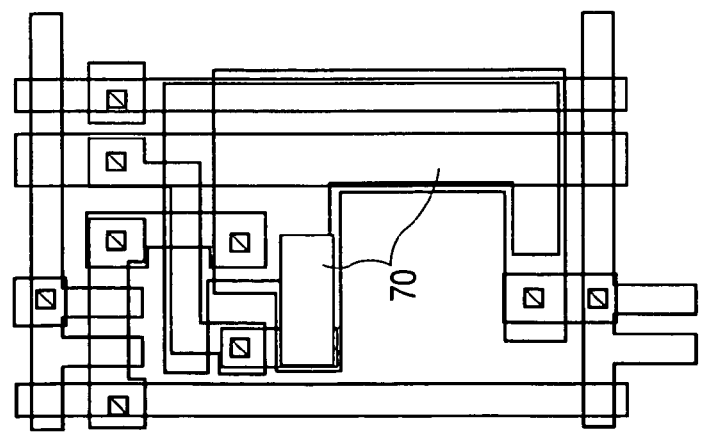
Figure 7I:
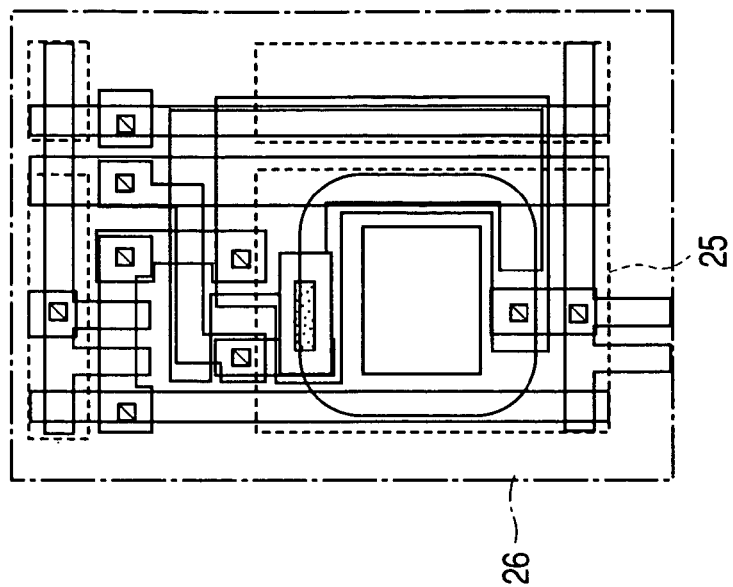
FIG. 7 is a view to show the formation step of the respective structural layers of the display module as shown in FIG. 3 following the step as shown in FIG. 6.
Figure 7H:
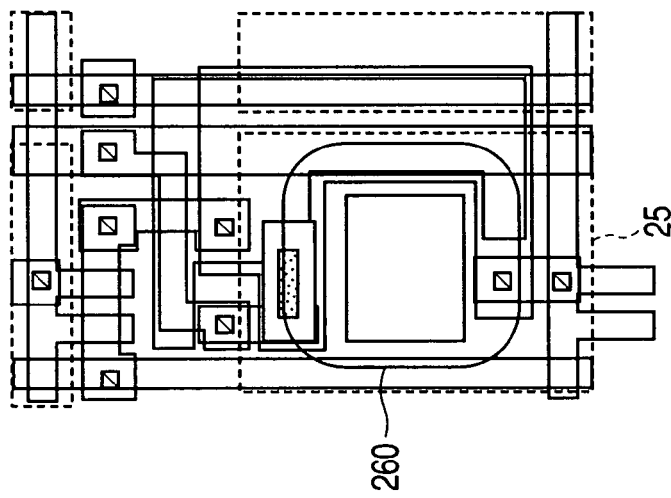
Figure 7G:
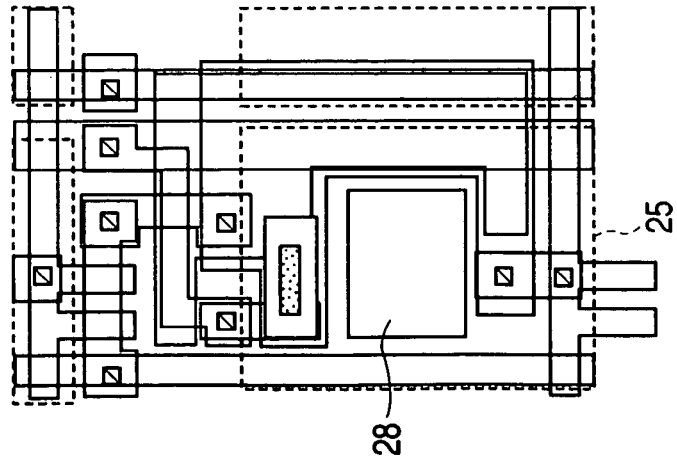

FIGS. 5 through 7 show the formation steps of the respective structural layers of the display module as shown in FIG. 3, the references (A) to (I) in which drawings indicate the formation of the respective structural layers. The layers as formed by the respective steps are shown with visible outlines.

At (A) in FIG. 5, a polysilicone layer 30 for the channel portion of the transistor and the lower electrode of the capacitor is formed on a glass substrate not shown in the drawing, on which layer laser annealing or heating operation is performed for crystallization. Then, a first insulating layer is formed of p-TEOS and as such on the annealed or heated layer.

At (B) in FIG. 5, a conductive layer 80 for the scanning lines, the gate of the transistor and the upper electrode of the capacitor is formed of titanium Ti or tungsten W and as such. The n-type ion implantation is performed thereon by using the upper electrode thereof as a mask layout.

At (C) in FIG. 5, a second insulating layer is formed on the conductive layer 80, on the required portions of which layer contact holes 270 are made by means of the wet etching method and so forth.

At (D) in FIG. 6, the drain of the transistor and the current supply line are formed with an aluminum wiring 70, the upper and lower sides of which wiring may be sandwiched with titanium Ti or tungsten W and as such.

At (E) in FIG. 6, a third insulating layer is formed on the aluminum wiring so as to form a contact hole 271 for an anode.

At (F) in FIG. 6, ITO is coated thereon for an anode of the OLED, on which patterning is performed so as to form an anode 25.

At (G) in FIG. 7, a passivation film is coated on the anode 25, through which file a hole is made so as to provide an aperture 28 for receiving an organic emitting layer, which aperture corresponds to the emitting region of the module.

At (H) in FIG. 7, an organic emitting layer 260 is coated on the aperture 28, which layer is coated on the region of the aperture including the circumferential edge thereof. For color display, an organic emitting layer to emit a given color light is coated on the aperture of the respective pixels.

At (I) in FIG. 7, a cathode 26 to cover the organic emitting layer 260 is formed so as to obtain a basic panel substrate. Thereafter, this panel substrate is sealed by an appropriate sealing structure so as to be put into a module form. Through the above production steps, the display module embodied in the present invention is obtained.

It should be noted that the present invention is not limited to the OLED display module, but is also applicable to another display module that emits light in the similar manner to the OLED module.

As described above, according to the present invention, the occurrence of line defects resulting from the short-circuit between the electrodes of the capacitor is prevented and the increase of the number of production process is avoided, so that the display module, the aperture ratio of the respective pixels of which module is improved so as to allow image to be displayed with high luminance and quality, is provided.

What is claimed is:

1. A display module comprising:
a plurality of pixels disposed in respective intersections between a plurality of scanning lines and a plurality of data lines, which lines are aligned in a matrix, and current supply lines that supply electric current to the pixels, with a pixel including a capacitor and an emitting device which emits light by the electric current supplied via a current supply line dedicated solely to serving as an electric current source to the pixel throughout each frame period in accordance with a data signal stored in the capacitor, the capacitor including a pair of electrodes and an insulating layer sandwiched therebetween,
wherein the current supply line supplying electric current to the pixel, and a data line supplying an adjacent-pixel data signal to an adjacent pixel neighboring the pixel, are separate lines from one another; and
wherein overlapped portions of the pair of electrodes of the capacitor also overlap both the current supply line supplying electric current to the pixel and the data line supplying the adjacent-pixel data signal to the adjacent pixel neighboring the pixel, via an insulation layer.

2. A display module according to claim 1,
wherein one electrode of the pair of electrodes is made of semiconductor material; and
wherein the other electrode of the pair of the electrodes is made of metal.

3. A display module according to claim 2, wherein the semiconductor material is made of doped semiconductor material.

4. A display module according to claim 3,
comprising a thin film transistor disposed in the pixel,
wherein said one electrode is disposed in a same layer as a channel of said thin film transistor.

5. A display module according to claim 4, wherein the other electrode is disposed in a same layer as a gate of said thin film transistor.

6. A display module according to claim 2,
comprising a thin film transistor disposed in the pixel,
wherein said one electrode is disposed in a same layer as a channel of said thin film transistor.

7. A display module according to claim 6, wherein the other electrode is disposed in a same layer as a gate of said thin film transistor.

8. A display module according to claim 1, comprising a thin film transistor disposed in the pixel, with a source or a drain of the thin film transistor connected to a current supply line, wherein one electrode of the pair of electrodes is connected to the gate of the thin film transistor and is not connected to the current supply lines.

9. A display module according to claim 1,
wherein each of data lines and current supply lines is disposed individually.

10. A display module comprising:
a plurality of pixels disposed in respective intersections between a plurality of scanning lines and a plurality of data lines, which lines are aligned in a matrix, and current supply lines that supply electric current to the pixels;
wherein a pixel includes an emitting device that emits light by the electric current supplied via a current supply line dedicated solely to serving as an electric current source to the pixel throughout each frame period in accordance with a data signal supplied via a data line, and a capacitor including a pair of electrodes and an insulating layer sandwiched therebetween,
wherein the current supply line supplying electric current to the pixel, and a data line supplying an adjacent-pixel data signal to an adjacent pixel neighboring the pixel, are separate lines from one another; and
wherein overlapped portions of the pair of electrodes of the capacitor also overlap both the current supply line supplying electric current to the pixel and the data line supplying the adjacent-pixel data signal to the adjacent pixel neighboring the pixel, via an insulation layer.

11. A display module according to claim 10,
wherein one electrode of the pair of electrodes is made of semiconductor material; and
wherein the other electrode of the pair of the electrodes is made of metal.

12. A display module according to claim 11, wherein the semiconductor material is made of doped semiconductor material.

13. A display module according to claim 12,
comprising a thin film transistor disposed in the pixel,
wherein said one electrode is disposed in a same layer as a channel of said thin film transistor.

14. A display module according to claim 13, wherein the other electrode is disposed in a same layer as a gate of said thin film transistor.

15. A display module according to claim 11,
comprising a thin film transistor disposed in the pixel,
wherein said one electrode is disposed in a same layer as a channel of said thin film transistor.

16. A display module according to claim 15, wherein the other electrode is disposed in a same layer as a gate of said thin film transistor.

17. A display module according to claim 10, comprising a thin film transistor disposed in the pixel, with a source or a drain of the thin film transistor connected to a current supply line, wherein one electrode of the pair of electrodes is connected to the gate of the thin film transistor and is not connected to the current supply lines.

18. A display module according to claim 10,
wherein each of data lines and current supply lines is disposed individually.

19. A display module comprising:
a plurality of pixels disposed in respective intersections between a plurality of scanning lines and plurality of data lines, which lines are aligned in a matrix, and current supply lines that supply electric current to the pixels; and
a pixel including a capacitor and an emitting device which emits light by the electric current supplied via a current supply line dedicated solely to serving as an electric current source to the pixel throughout each frame period in accordance with a data signal stored in the capacitor, the capacitor including a pair of electrodes and an insulating layer sandwiched therebetween, wherein the current supply line supplying electric current to the pixel, and a data line supplying an adjacent-pixel data signal to an adjacent pixel neighboring the pixel, are separate lines from one another;

wherein the pair of electrodes of the capacitor also overlap both the current supply line supplying electric current to the pixel and the data line supplying the adjacent-pixel data signal to the adjacent pixel neighboring the pixel, via an insulation layer; and wherein one electrode of the capacitor of the pixel, is connected to a scanning line of another pixel neighboring the pixel, where the scanning line serves momentarily during each frame period to scan in an another-pixel data signal into the another pixel.

20. A display module comprising:

a plurality of pixels disposed in respective intersections between a plurality of scanning lines and plurality of data lines, which lines are aligned in a matrix, and current supply lines that supply electric current to the pixels, wherein a pixel of the pixels includes an emitting device that emits light by the electric current via a current supply line dedicated solely to serving as an electric current source to the pixel throughout each frame period in accordance with a data signal supplied via a data line, and a capacitor including a pair of electrodes and an insulating layer sandwiched therebetween, wherein a current supply line supplying electric current to the pixel, and a data line supplying an adjacent-pixel data signal to an adjacent pixel neighboring the pixel, are separate lines from one another;

wherein the pair of electrodes of the capacitor overlap the current supply line supplying electric current to the pixel and the data line supplying the adjacent-pixel data signal to the adjacent pixel neighboring the pixel, via an insulation layer; and wherein one electrode of the capacitor of the pixel, is connected to a scanning line of another pixel neighboring the pixel, where the scanning line serves momentarily during each frame period to scan in an another-pixel data signal into the another pixel.

* * * * *